(12) United States Patent
Miao et al.

(10) Patent No.: US 9,865,352 B2
(45) Date of Patent: Jan. 9, 2018

(54) PROGRAM SEQUENCING

(71) Applicant: SanDisk Technologies, Inc., Plano, TX (US)

(72) Inventors: Xiaochang Miao, Fremont, CA (US); Ken Oowada, Fujisawa (JP); Genki Sano, Kamakura (JP); Deepanshu Dutta, Milpitas, CA (US)

(73) Assignee: SANDISK TECHNOLOGIES, LLC, Plano, TX (US)

( * ) Notice: Subject to any disclaimer, the term of this patent is extended or adjusted under 35 U.S.C. 154(b) by 0 days.

(21) Appl. No.: 15/061,940

(22) Filed: Mar. 4, 2016

(65) Prior Publication Data

US 2017/0125101 A1     May 4, 2017

Related U.S. Application Data

(63) Continuation of application No. 62/247,600, filed on Oct. 28, 2015.

(51) Int. Cl.
| | |
|---|---|
| *G11C 11/34* | (2006.01) |
| *G11C 16/10* | (2006.01) |
| *G11C 11/56* | (2006.01) |
| *G11C 16/04* | (2006.01) |
| *G11C 16/34* | (2006.01) |

(52) U.S. Cl.
CPC .......... *G11C 16/10* (2013.01); *G11C 11/5628* (2013.01); *G11C 16/0483* (2013.01); *G11C 16/3418* (2013.01); *G11C 16/3427* (2013.01); *G11C 2211/5648* (2013.01)

(58) Field of Classification Search
CPC . G11C 16/10; G11C 11/5628; G11C 16/0483; G11C 16/3418; G11C 16/3427
USPC .......................... 365/185.11, 185.18, 185.24
See application file for complete search history.

(56) References Cited

U.S. PATENT DOCUMENTS

| | | | |
|---|---|---|---|
| 8,493,781 B1 * | 7/2013 | Meir | G11C 11/5628 365/185.01 |
| 8,824,214 B2 * | 9/2014 | Shur | G11C 13/0002 365/185.03 |
| 9,239,782 B2 * | 1/2016 | Yang | G06F 12/0246 |
| 9,349,478 B2 * | 5/2016 | Yuan | G11C 16/3427 |
| 9,373,367 B1 * | 6/2016 | Kim | G11C 16/08 |
| 2003/0011399 A1 * | 1/2003 | Liu | G11C 16/3427 326/35 |
| 2008/0008008 A1 * | 1/2008 | Chen | G11C 11/5628 365/185.28 |

(Continued)

*Primary Examiner* — Viet Q Nguyen
(74) *Attorney, Agent, or Firm* — Kunzler, PC

(57) ABSTRACT

Apparatuses, systems, methods, and computer program products are disclosed for program sequencing. An apparatus includes a block of non-volatile storage cells having a plurality of word lines. The word lines are organized into a monotonically increasing sequence. The apparatus includes a controller for the block. The controller is configured to program a set of storage cells of a word line to one or more storage states above a predetermined threshold and to program a set of storage cells of a previous word line adjacent to and before the word line in the sequence, to one or more storage states below the predetermined threshold after programming the set or storage cells of the word line to the one or more storage states above the predetermined threshold.

18 Claims, 10 Drawing Sheets

(56) References Cited

U.S. PATENT DOCUMENTS

| | | | |
|---|---|---|---|
| 2008/0137416 A1* | 6/2008 | Lee | G11C 11/5628 365/185.03 |
| 2008/0259684 A1* | 10/2008 | Shlick | G11C 11/5628 365/185.03 |
| 2009/0323429 A1* | 12/2009 | Lee | G11C 11/5628 365/185.19 |
| 2010/0002513 A1* | 1/2010 | Lutze | G11C 11/5635 365/185.17 |
| 2012/0033500 A1* | 2/2012 | Dutta | G11C 11/5628 365/185.19 |
| 2012/0055670 A1* | 3/2012 | Armstrong | C09K 8/685 166/280.1 |
| 2012/0287716 A1* | 11/2012 | Li | G11C 16/3459 365/185.17 |
| 2016/0093390 A1* | 3/2016 | Yuan | G11C 16/3427 714/764 |

* cited by examiner

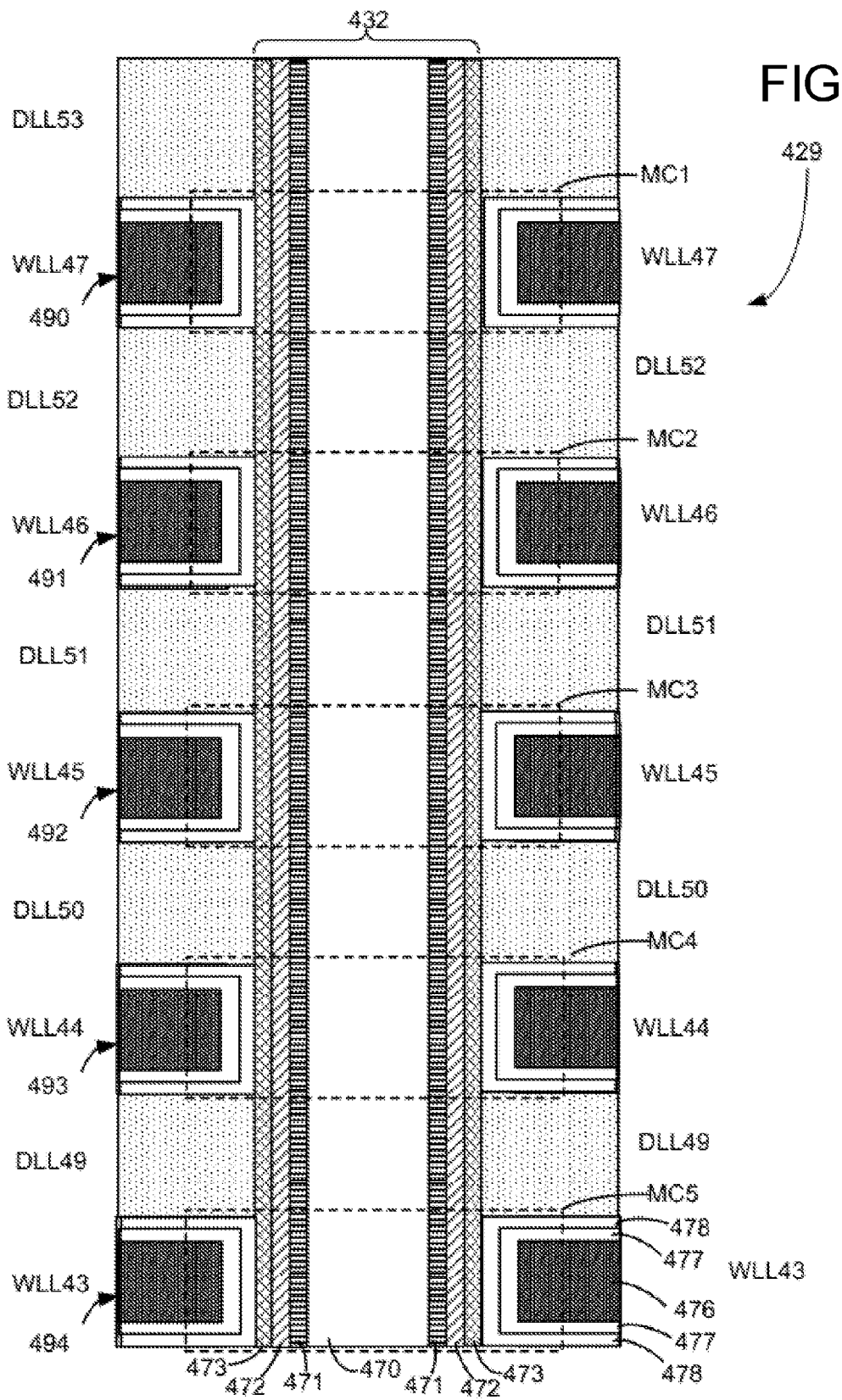

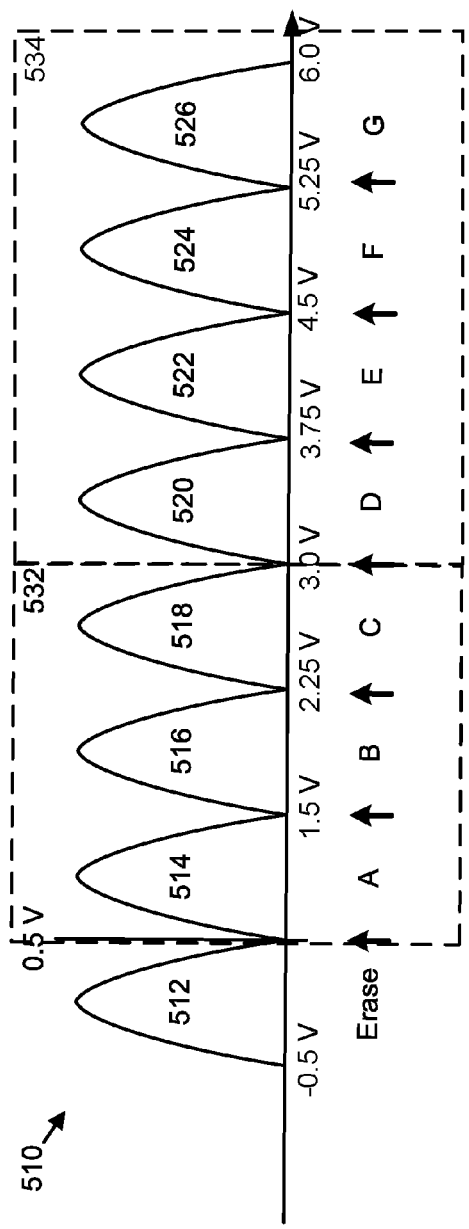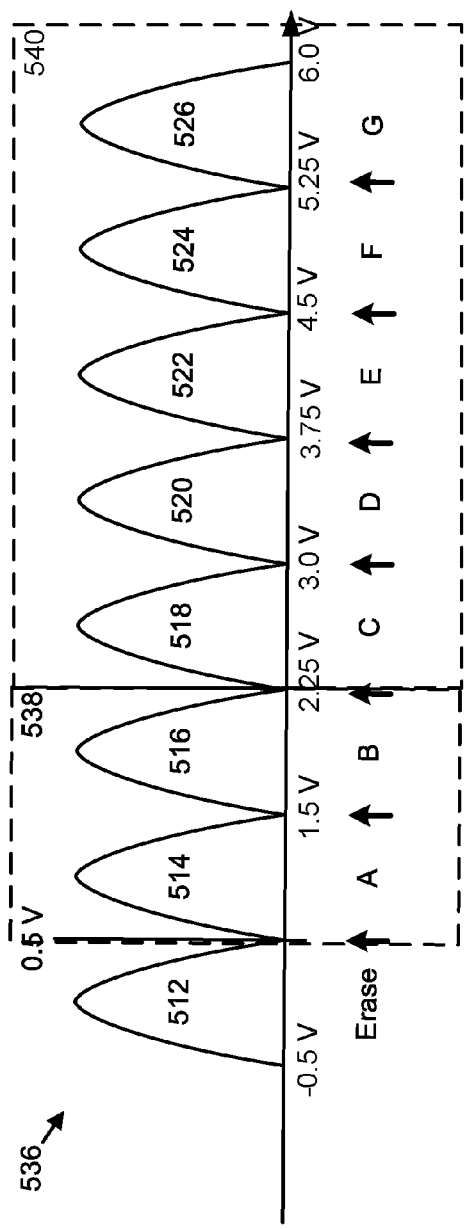

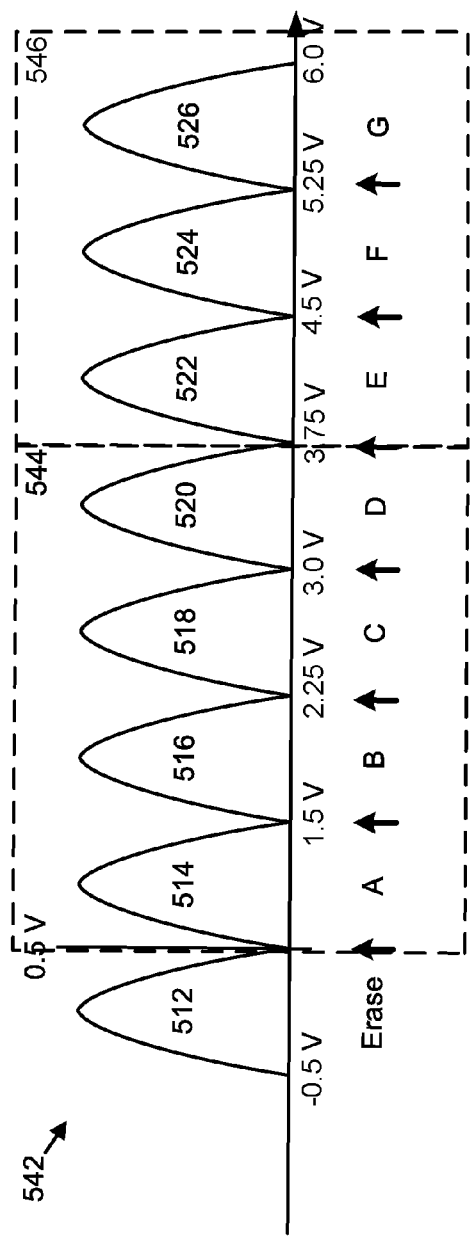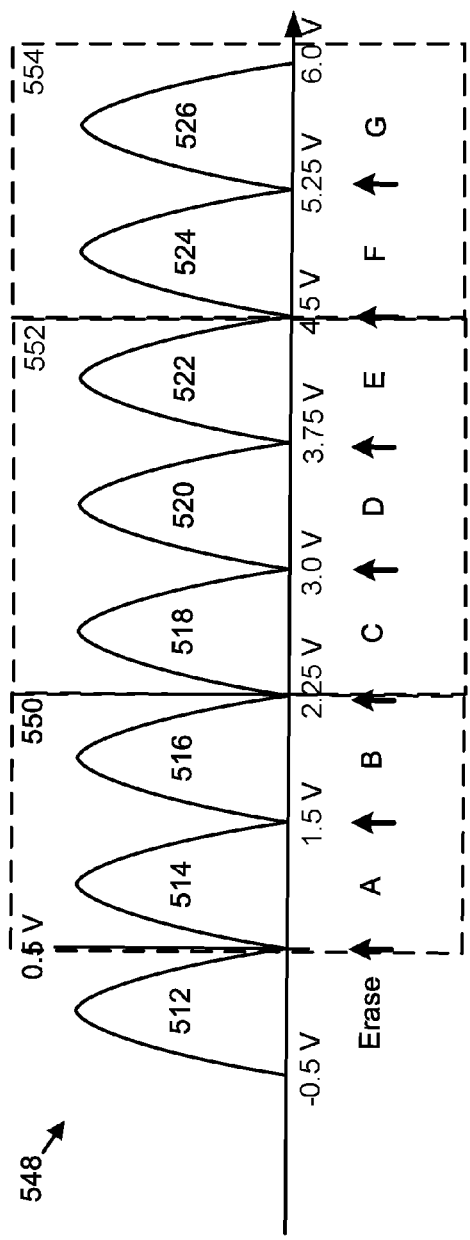

PROGRAM SEQUENCING

CROSS-REFERENCES TO RELATED APPLICATIONS

This application claims the benefit of U.S. Provisional Patent Application No. 62/247,600 entitled "Zigzag High-State First (ZHSF) Program Scheme for 3D Charge-Trapping NAND" and filed on Oct. 28, 2015, for Ziaochang Miao, et al., which is incorporated herein by reference in its entirety.

TECHNICAL FIELD

The present disclosure, in various embodiments, relates to memory and/or storage devices and more particularly relates to program sequencing for memory and/or storage devices.

BACKGROUND

Many data storage devices, such as flash memory devices, store data in cells of non-volatile media. A physical property of each cell, such as a stored charge, voltage, material phase, electrical resistance, magnetization, or the like, is alterable to encode data. A cell's physical property may be variable across a range, which may be divided into discrete states, so that different states correspond to different data values. Sensing whether the cell's physical property satisfies one or more read thresholds (e.g., voltage thresholds, resistivity thresholds, or the like) within its range determines the cell's state, thus allowing recovery of a stored data value.

The data-encoding physical property of a cell may vary over time due to cell damage, charge leakage, temperature effects, disturbances from nearby cells, or the like. An error may occur if the cell moves from one state into an adjacent state. As storage density increases, feature size shrinks, making the cells more susceptible to such disturbances.

SUMMARY

Apparatuses are presented for program sequencing. In one embodiment, an apparatus includes a block of non-volatile storage cells having a plurality of word lines. In such an embodiment, the word lines are organized into a monotonically increasing sequence. An apparatus, in a further embodiment, includes a controller for the block. The controller is configured to program a set of storage cells of a word line to one or more storage states above a predetermined threshold and to program a set of storage cells of a previous word line adjacent to and before the word line in the sequence, to one or more storage states below the predetermined threshold after programming the set or storage cells of the word line to the one or more storage states above the predetermined threshold.

Methods are presented for program sequencing. A method, in one embodiment, includes programming a group of memory cells of a first word line to one or more charge levels greater than a threshold level. In another embodiment, a method includes programming a group of memory cells of a word line having a lower word line address than the first word line to one or more charge levels lower than the threshold level after programming the group of memory cells of the first word line to the one or more charge levels greater than the threshold level. A method, in certain embodiments, includes programming a group of memory cells of a word line having a higher word line address than the first word line to the one or more charge levels greater than the threshold level after programming the group of memory cells of the word line having a lower word line address to the one or more charge levels lower than the threshold level.

An apparatus, in one embodiment, includes means for determining which cells of a non-volatile memory medium are to be programmed to one or more states above a read voltage threshold and which cells are to be programmed to one or more states below the read voltage threshold, the non-volatile memory medium including a monotonically increasing series of word lines of cells. In certain embodiments, an apparatus includes means for programming cells of subsequent word lines in the monotonically increasing series to the one or more states above the read voltage threshold prior to programming cells of previous word lines in the monotonically increasing series to the one or more states below the read voltage threshold such that one or more cells of a previous word line are not programmed to the one or more states below the read voltage threshold until after one or more cells of a subsequent word line have been programmed to the one or more states above the read voltage threshold. In such embodiments, the read voltage threshold may be between about 2 and about 4 volts.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which:

FIG. 2 illustrates one embodiment of a 3D, vertical NAND flash memory structures;

FIG. 5B is a diagram illustrating one embodiment of storage state groups for a multi-level storage cell of solid-state storage media storing at least three bits;

FIG. 5C is a diagram illustrating another embodiment of storage state groups for a multi-level storage cell of solid-state storage media storing at least three bits;

FIG. 5D is a diagram illustrating yet another embodiment of storage state groups for a multi-level storage cell of solid-state storage media storing at least three bits;

FIG. 5E is a diagram illustrating a further embodiment of storage state groups for a multi-level storage cell of solid-state storage media storing at least three bits;

DETAILED DESCRIPTION

Figure 1A:
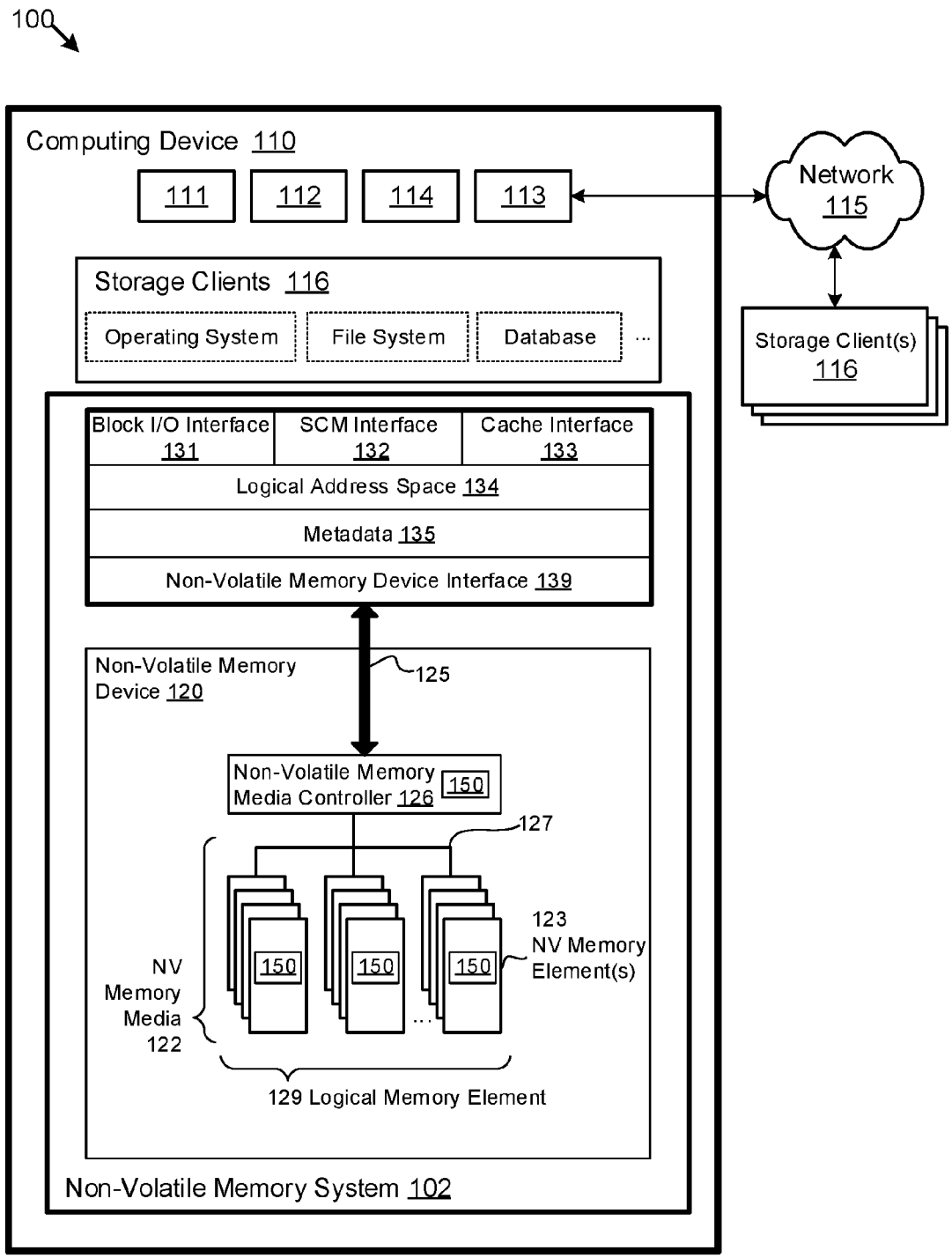
FIG. 1A is a schematic block diagram illustrating one embodiment of a system for program sequencing.

Aspects of the present disclosure may be embodied as an apparatus, system, method, or computer program product.

Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1A is a block diagram of one embodiment of a system 100 comprising a program sequencing component 150 for a non-volatile memory device 120. The program sequencing component 150 may be part of and/or in communication with a non-volatile memory media controller 126, a non-volatile memory element 123, a device driver, or the like. The program sequencing component 150 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or non-volatile memory controller 126 to a communication network 115, such as an Internet Protocol (IP) network, a Storage Area Network (SAN), wireless network, wired network, or the like.

The non-volatile memory device 120, in various embodiments, may be disposed in one or more different locations relative to the computing device 110. In one embodiment, the non-volatile memory device 120 comprises one or more non-volatile memory elements 123, such as semiconductor chips or packages or other integrated circuit devices disposed on one or more printed circuit boards, storage housings, and/or other mechanical and/or electrical support structures. For example, the non-volatile memory device 120 may comprise one or more direct inline memory module (DIMM) cards, one or more expansion cards and/or daughter cards, a solid-state-drive (SSD) or other hard drive device, and/or may have another memory and/or storage form factor. The non-volatile memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The non-volatile memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the non-volatile memory device 120 may be disposed on a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the non-volatile memory device 120 may be disposed on a data network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The computing device 110 may further comprise a non-transitory, computer readable storage medium 114. The computer readable storage medium 114 may comprise executable instructions configured to cause the computing device 110 (e.g., processor 111) to perform steps of one or more of the methods disclosed herein. Alternatively, or in addition, the program sequencing component 150 may be embodied as one or more computer readable instructions stored on the non-transitory storage medium 114.

The non-volatile memory system 102, in the depicted embodiment, includes a program sequencing component 150. The program sequencing component 150, in one embodiment, is configured to manage a sequence of storing data for the non-volatile memory device 120 described below. The program sequencing component 150, in certain embodiments, may program a group of memory cells of a first word line to one or more charge levels greater than a threshold level. The program sequencing component 150 may also program a group of memory cells of a word line having a lower word line address than the first word line to one or more charge levels lower than the threshold level after programming the group of memory cells of the first word line to the one or more charge levels greater than the threshold level. The program sequencing component 150 may program a group of memory cells of a word line having a higher word line address than the first word line to the one or more charge levels greater than the threshold level after programming the group of memory cells of the word line having a lower word line address to the one or more charge levels lower than the threshold level. Thus, word line interference may be reduced from occurring on word lines adjacent to word lines programmed with charge levels higher than the threshold level.

In one embodiment, the program sequencing component 150 may comprise logic hardware of one or more non-volatile memory devices 120, such as a non-volatile memory media controller 126, a non-volatile memory element 123, a device controller, a field-programmable gate array (FPGA) or other programmable logic, firmware for an FPGA or other programmable logic, microcode for execution on a microcontroller, an application-specific integrated circuit (ASIC), or the like. In another embodiment, the program sequencing component 150 may comprise executable software code, such as a device driver or the like, stored on the computer readable storage medium 114 for execution on the processor 111. In a further embodiment, the program sequencing component 150 may include a combination of both executable software code and logic hardware.

In one embodiment, the program sequencing component 150 is configured to receive storage requests from a device driver or other executable application via a bus 125 or the like. The program sequencing component 150 may be further configured to transfer data to/from a device driver and/or storage clients 116 via the bus 125. Accordingly, the program sequencing component 150, in some embodiments, may comprise and/or be in communication with one or more direct memory access (DMA) modules, remote DMA modules, bus controllers, bridges, buffers, and so on to facilitate the transfer of storage requests and associated data. In another embodiment, the program sequencing component 150 may receive storage requests as an API call from a storage client 116, as an IO-CTL command, or the like.

According to various embodiments, a non-volatile memory controller 126 in communication with one or more program sequencing components 150 may manage one or more non-volatile memory devices 120 and/or non-volatile memory elements 123. The non-volatile memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, blocks, sectors, collections or sets of physical storage locations (e.g., logical pages, logical blocks), or the like.

A device driver and/or the non-volatile memory media controller 126, in certain embodiments, may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the non-volatile memory device 120 may maintain metadata 135, such as a logical to physical address mapping structure, to map logical addresses of the logical address space 134 to media storage locations on the non-volatile memory device(s) 120. A device driver may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

A device driver may be communicatively coupled to one or more non-volatile memory devices 120. The one or more non-volatile memory devices 120 may include different types of non-volatile memory devices including, but not limited to: solid-state storage devices, semiconductor storage devices, SAN storage resources, or the like. The one or more non-volatile memory devices 120 may comprise one or more respective non-volatile memory media controllers 126 and non-volatile memory media 122. A device driver may provide access to the one or more non-volatile memory devices 120 via a traditional block I/O interface 131. Additionally, a device driver may provide access to enhanced functionality through the SCM interface 132. The metadata 135 may be used to manage and/or track data operations performed through any of the Block I/O interface 131, SCM interface 132, cache interface 133, or other, related interfaces.

The cache interface 133 may expose cache-specific features accessible via a device driver for the non-volatile memory device 120. Also, in some embodiments, the SCM interface 132 presented to the storage clients 116 provides access to data transformations implemented by the one or more non-volatile memory devices 120 and/or the one or more non-volatile memory media controllers 126.

A device driver may present a logical address space 134 to the storage clients 116 through one or more interfaces. As discussed above, the logical address space 134 may comprise a plurality of logical addresses, each corresponding to respective media locations the on one or more non-volatile memory devices 120. A device driver may maintain metadata 135 comprising any-to-any mappings between logical addresses and media locations, or the like.

A device driver may further comprise and/or be in communication with a non-volatile memory device interface 139 configured to transfer data, commands, and/or queries to the one or more non-volatile memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the non-volatile memory controller 126 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The non-volatile memory controller 126 is part of and/or in communication with one or more non-volatile memory devices 120. Although FIG. 1A depicts a single non-volatile memory device 120, the disclosure is not limited in this regard and could be adapted to incorporate any number of non-volatile memory devices 120.

The non-volatile memory device 120 may comprise one or more elements 123 of non-volatile memory media 122, which may include but is not limited to: ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more elements 123 of non-volatile memory media 122, in certain embodiments, comprise storage class memory (SCM).

While legacy technologies such as NAND flash may be block and/or page addressable, storage class memory, in one embodiment, is byte addressable. In further embodiments, storage class memory may be faster and/or have a longer life (e.g., endurance) than NAND flash; may have a lower cost, use less power, and/or have a higher storage density than DRAM; or offer one or more other benefits or improvements when compared to other technologies. For example, storage class memory may comprise one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 122 is referred to herein as "memory media," in various embodiments, the non-volatile memory media 122 may more generally comprise one or more non-volatile recording media capable of recording data, which may be referred to as a non-volatile memory medium, a non-volatile storage medium, or the like. Further, the non-volatile memory device 120, in various embodiments, may comprise a non-volatile recording device, a non-volatile memory device, a non-volatile storage device, or the like.

The non-volatile memory media 122 may comprise one or more non-volatile memory elements 123, which may include, but are not limited to: chips, packages, planes, die, or the like. A non-volatile memory media controller 126 may be configured to manage data operations on the non-volatile memory media 122, and may comprise one or more processors, programmable processors (e.g., FPGAs), ASICs, micro-controllers, or the like. In some embodiments, the non-volatile memory media controller 126 is configured to store data on and/or read data from the non-volatile memory media 122, to transfer data to/from the non-volatile memory device 120, and so on.

The non-volatile memory media controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the non-volatile memory media controller 126 in parallel. This parallel access may allow the non-volatile memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the non-volatile memory elements.

The non-volatile memory controller 126 may organize a block of word lines within a non-volatile memory element 123, in certain embodiments, using addresses of the word lines, such that the word lines are logically organized into a monotonically increasing sequence (e.g., decoding and/or translating addresses for word lines into a monotonically increasing sequence, or the like). In a further embodiment, word lines of a block within a non-volatile memory element 123 may be physically arranged in a monotonically increasing sequence of word line addresses, with consecutively addressed word lines also being physically adjacent (e.g., WL0, WL1, WL2, . . . WLN).

The non-volatile memory controller 126 may comprise and/or be in communication with a device driver executing on the computing device 110. A device driver may provide storage services to the storage clients 116 via one or more interfaces 131, 132, and/or 133. In some embodiments, a device driver provides a block-device I/O interface 131 through which storage clients 116 perform block-level I/O operations. Alternatively, or in addition, a device driver may provide a storage class memory (SCM) interface 132, which may provide other storage services to the storage clients 116. In some embodiments, the SCM interface 132 may comprise extensions to the block device interface 131 (e.g., storage clients 116 may access the SCM interface 132 through extensions or additions to the block device interface 131). Alternatively, or in addition, the SCM interface 132 may be provided as a separate API, service, and/or library. A device driver may be further configured to provide a cache interface 133 for caching data using the non-volatile memory system 102.

A device driver may further comprise a non-volatile memory device interface 139 that is configured to transfer data, commands, and/or queries to the non-volatile memory media controller 126 over a bus 125, as described above.

Figure 1B:
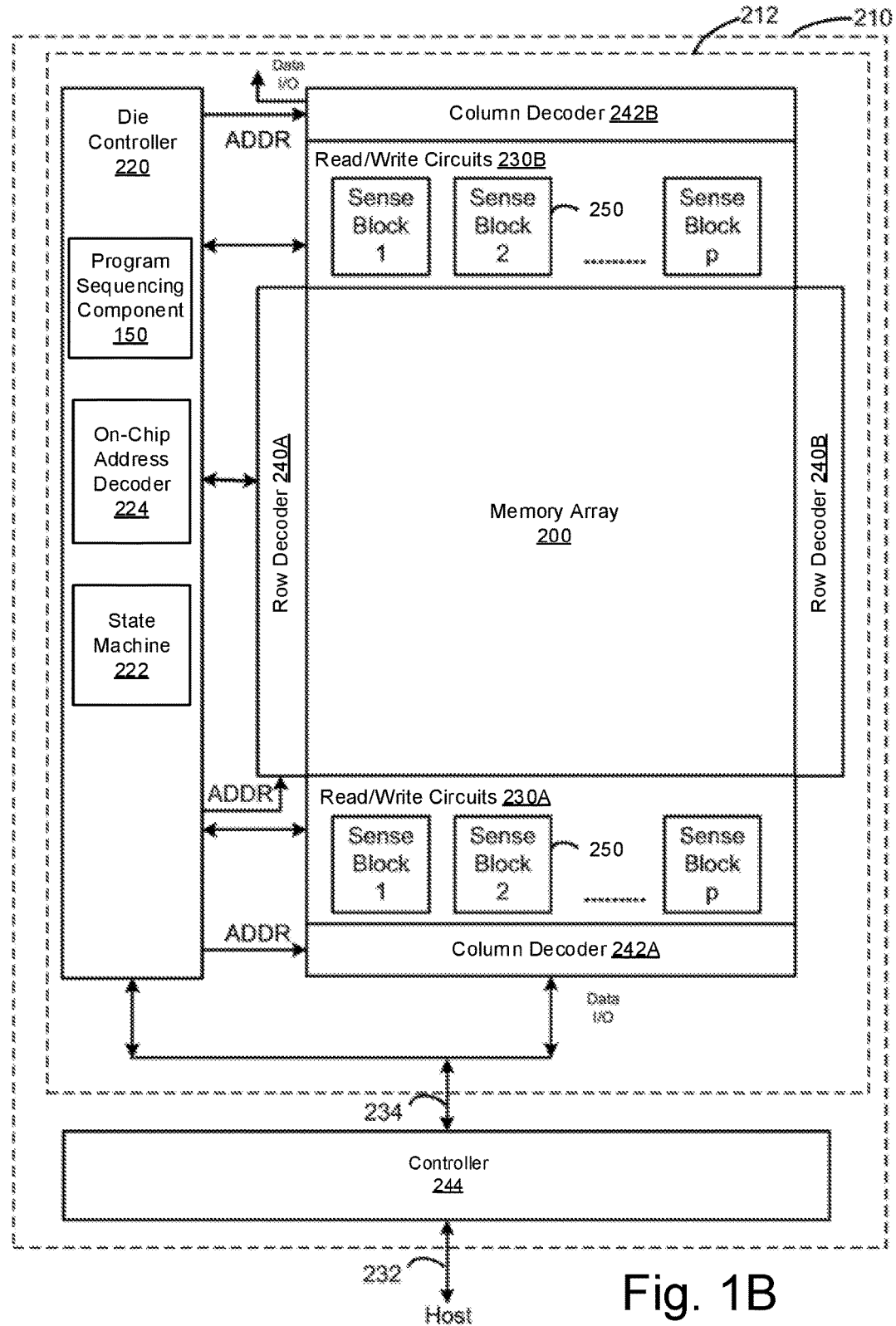
FIG. 1B is a schematic block diagram illustrating another embodiment of a system for program sequencing.

FIG. 1B illustrates an embodiment of a non-volatile storage device 210 that may include one or more memory die or chips 212. Memory die 212, in some embodiments, includes an array (two-dimensional or three dimensional) of memory cells 200, die controller 220, and read/write circuits 230A/230B. In one embodiment, access to the memory array 200 by the various peripheral circuits is implemented in a symmetric fashion, on opposite sides of the array, so that the densities of access lines and circuitry on each side are reduced by half. The read/write circuits 230A/230B, in a further embodiment, include multiple sense blocks 250 which allow a page of memory cells to be read or programmed in parallel.

The memory array 200, in various embodiments, is addressable by word lines via row decoders 240A/240B and by bit lines via column decoders 242A/242B. In some embodiments, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Die controller 220, in one embodiment, cooperates with the read/write circuits 230A/230B to perform memory operations on the memory array 200. The die controller 220, in certain embodiments, includes a program sequencing component 150, a state machine 222, and an on-chip address decoder 224. In one embodiment, the state machine 222 comprises at least a portion of the program sequencing component 150. In a further embodiment, the controller 244 comprises at least a portion of the program sequencing component 150.

The program sequencing component 150, in one embodiment, is configured to program a set of storage cells of a word line to one or more storage states above a predetermined threshold and/or program a set of storage cells of a previous word line adjacent to and before the word line in the sequence, to one or more storage states below the predetermined threshold after programming the set or storage cells of the word line to the one or more storage states above the predetermined threshold.

The state machine 222, in one embodiment, provides chip-level control of memory operations. The on-chip address decoder 224 provides an address interface to convert between the address that is used by the host or a memory controller to the hardware address used by the decoders 240A, 240B, 242A, 242B. In certain embodiments, the state machine 222 includes an embodiment of the program sequencing component 150. The program sequencing component 150, in some embodiments, programs storage states above a predetermined threshold before programming storage states below the predetermined threshold to decrease word line interference. The program sequencing component 150, in certain embodiments, is embodied as software in a device driver, hardware in a device controller 244, and/or hardware in a die controller 220 and/or state machine 222.

In one embodiment, one or any combination of die controller 220, program sequencing component 150, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

FIG. 2 illustrates one embodiment of a cross sectional view of a 3D, vertical NAND flash memory structure 429 or string 429. In one embodiment, the vertical column 432 is round and includes four layers; however, in other embodiments more or less than four layers can be included and other shapes can be used (e.g., a "U" shape instead of an "I" shape or the like). In one embodiment, a vertical column 432 includes an inner core layer 470 that is made of a dielectric, such as SiO$_2$. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is a shared charge trapping layer 473, such as (for example) Silicon Nitride. Other memory materials and structures can also be used. The technology described herein is not limited to any particular material or structure.

FIG. 2 depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide (SiO$_2$) layer 478. The physical interaction of the word line layers with the vertical column forms the memory cells. Thus, a memory cell, in one embodiment, comprises channel 471, tunneling dielectric 472, charge trapping layer 473 (e.g., shared with other memory cells), blocking oxide layer 478, aluminum oxide layer 477 and word line region 476. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Storage cells in the same location or position in different memory structures 429 (e.g., different NAND strings 429) on different bit lines, in certain embodiments, may be on the same word line. Each word line may store one page, such as single level cells (SLC); two pages, such as multilevel cells (MLC); three pages, such as triple level cells (TLC); four pages, such as quad level cells (QLC); or another number of pages.

In the depicted embodiment, a vertical, 3D NAND flash memory structure 429 comprises an "I" shaped memory structure 429. In other embodiments, a vertical, 3D NAND flash memory structure 429 may comprise a "U" shaped structure, or may have another vertical and/or stacked architecture. In certain embodiments, four sets of strings 429 (e.g., four sets of 48 word lines, or another predefined number of word lines) may form an erase block, while in other embodiments, fewer or more than four sets of strings 429 may form an erase block. As may be appreciated, any suitable number of storage cells may be part of a single string 429. In one embodiment, a single string 429 includes 48 storage cells.

Figure 3:
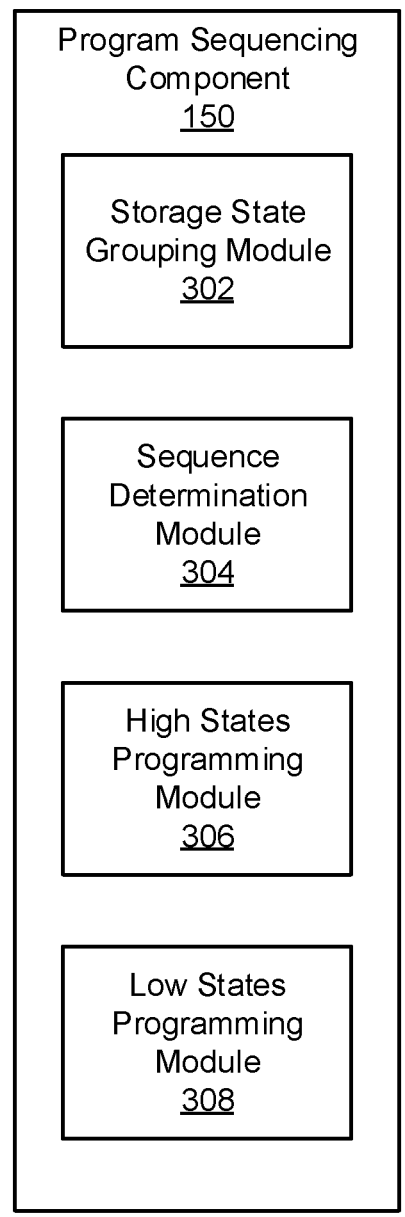
FIG. 3 is a schematic block diagram illustrating one embodiment of a program sequencing component.

FIG. 3 depicts one embodiment of a program sequencing component 150. The program sequencing component 150 may be substantially similar to the program sequencing component 150 described above with regard to FIGS. 1A and 1B. In general, as described above, the program sequencing component 150 sequences programming of memory cells so that high states on a word line are programmed before low states on an adjacent word line to reduce word line interference. As used herein, high states may comprise storage states above a predetermined threshold and low states may comprise storage states below a predetermined threshold. In the depicted embodiment, the program sequencing component 150 includes a storage state grouping module 302, a sequence determination module 304, a high states programming module 306, and a low states programming module 308.

In various embodiments, the storage state grouping module 302 may determine how storage states are grouped together for programming. In one embodiment, the storage state grouping module 302 determines a group of high states to program together and a group of low states to program together. In such embodiments, the group of high states may be storage states that have a programming value (e.g., current, voltage, resistivity, or the like) above a predetermined threshold (N) (e.g., threshold current, threshold voltage, threshold resistivity, or the like) and the group of low states may be storage states that have a programming value below the predetermined threshold N. As may be appreciated, the predetermined threshold N may be set during manufacturing, or at some later time, such as during operation. In certain embodiments, the storage state grouping module 302 may determine one or more groups of medium states to program together (e.g., storage states below a first threshold and above a second threshold).

In one example, each memory cell may be a multi-level cell (MLC) that may be programmed to a specific number of storage states. The number of storage states may be any suitable number. For example, the MLC may have 2, 4, 8, 16, 32, 62, fewer, or more storage states. In one embodiment in which the MLC has 8 total storage states (triple level cell (TLC)), the 7 programmed storage states may be defined as storage states A, B, C, D, E, F, and G. In such an embodiment, storage state A may correspond to a programmed voltage of approximately 0.5 to 1.5 volts, storage state B may correspond to a programmed voltage of approximately 1.5 to 2.25 volts, storage state C may correspond to a programmed voltage of approximately 2.25 to 3.0 volts, storage state D may correspond to a programmed voltage of approximately 3.0 to 3.75 volts, storage state E may correspond to a programmed voltage of approximately 3.75 to 4.5 volts, storage state F may correspond to a programmed voltage of approximately 4.5 to 5.25 volts, and storage state G may correspond to a programmed voltage of approximately 5.25 to 6.0 volts. In such an example, the predetermined threshold N may be any suitable division between storage states, such as about 1.5 volts, about 2.0 volts, about 2.25 volts, about 2.5 volts, about 3.0 volts, about 3.5 volts, about 3.75 volts, about 4.0 volts, about 4.5 volts, about 5.25 volts, and so forth.

In an embodiment in which there are only two groups—a group of high states and a group of low states—the storage state grouping module 302 may group approximately half of the high states together and approximately half of the low states together, with the predetermined threshold N being between the group of high states and the group of low states. For example, in TLC, storage states A, B, and C may be grouped together as a group of low states, and storage states D, E, F, and G may be grouped together as a group of high states. As another example, storage state A and one or more of storage states B, C, D, E, and F may be grouped together as a group of low states, and storage state G and one or more of storage states B, C, D, E, and F may be grouped together as a group of high states.

As may be appreciated, the group of high states may include the highest storage state and the group of high states may include storage states that are all adjacent. For example, in TLC, the group of high states includes storage state G and may include storage states E and F, but may not include only storage states E and G. Furthermore, the group of low states may include the lowest storage state and the group of low storage states may include storage states that are all adjacent. For example, in TLC, the group of low states includes storage state A and may include storage states B and C, but may not include only storage states A and C.

The division (e.g., predetermined threshold N) between the group of high states and the group of low states may be determined using any suitable criteria. For example, the division between the group of high states and the group of low states may be determined based on what produces the lowest memory cell interference, the components used for programming the different storage states, and so forth.

In certain embodiments, the storage state grouping module 302 determines one or more groups of middle states. Each group of middle states may include adjacent storage states and may not include the highest or the lowest storage state. In one embodiment, the group of high states only includes the highest storage state, the group of low states only includes the lowest storage state, and there is a group of middle states for each storage state between the highest and lowest storage states. For example, in TLC, the group of high states includes storage state G, the group of low states includes storage state A, a first group of middle states includes storage state B, a second group of middle states includes storage state C, a third group of middle states includes storage state D, a fourth group of middle states includes storage state E, and a fifth group of middle states includes storage state F.

In one embodiment, the sequence determination module 304 determines a sequence for programming word lines with the group of high states, the group of low states, and/or the groups of middle states. The determined sequence programs high storage states of a word line before programming low storage states of an adjacent word line to decrease word line interference that may result from programming of high storage states.

For example, the sequence determination module 304 may determine to program a set of storage cells of a word line to one or more storage states above a predetermined threshold, and to program a set of storage cells of a previous word line adjacent to and before the word line in a sequence, to one or more storage states below the predetermined threshold after programming the set of storage cells of the word line to the one or more storage states above the predetermined threshold. In such an example, the sequence determination module 304 may determine to iterate through the word lines of a block of non-volatile storage cells by programming sets of storage cells of successive word lines to the one or more storage states above the predetermined threshold before programming sets of storage cells of previous word lines to the one or more storage states below the predetermined threshold.

In one embodiment, the sequence determination module 304 may determine to iterate through the word lines of a block of non-volatile storage cells until each word line includes a set of storage cells programmed to the one or more storage states above the predetermined threshold and a set of storage cells programmed to the one or more storage states below the predetermined threshold. In certain embodiments, the sequence determination module 304 may program the set of storage cells programmed to the one or more storage states above the predetermined threshold before programming the set of storage cells programmed to the one or more storage states below the predetermined threshold for each word line of a block of non-volatile storage cells. In some embodiments, a word line is physically adjacent to a previous word line and has a higher word line address in a monotonically increasing sequence than a word line address of the previous word line.

In an embodiment in which there are only two groups—a group of high states and a group of low states—the sequence determination module 304 may program the word lines (WL) with the groups of high and low states using the following sequence:

TABLE 1

| Sequence Number | Programmed Cells |
| --- | --- |
| 1 | High States WL0 |
| 2 | High States WL1 |
| 3 | Low States WL0 |
| 4 | High States WL2 |
| 5 | Low States WL1 |
| 6 | High States WL3 |
| 7 | Low States WL2 |

As may be appreciated, the pattern of Table 1 may continue for the total number of word lines to be programmed. Furthermore, programming the group of high states or the group of low states of a word line may include programming each string associated with the word line. The strings may be programmed in any suitable order.

As another example, in an embodiment in which there are three groups—a group of high states, a group of low states, and a group of medium states—the sequence determination module 304 may program the word lines with the groups of high, low, and medium states as shown in Table 2. As may be appreciated, the pattern of Table 2 may continue for the total number of word lines to be programmed.

TABLE 2

| Sequence Number | Programmed Cells |
| --- | --- |
| 1 | High States WL0 |
| 2 | High States WL1 |
| 3 | High States WL2 |
| 4 | Medium States WL0 |
| 5 | Medium States WL1 |
| 6 | Low States WL0 |

TABLE 2-continued

| Sequence Number | Programmed Cells |
|---|---|
| 7 | High States WL3 |
| 8 | Medium States WL2 |
| 9 | Low States WL1 |
| 10 | High States WL4 |
| 11 | Medium States WL3 |
| 12 | Low States WL2 |

In certain embodiments, the sequence determination module 304 may determine a sequence that includes programming the group of high states for all word lines, then programming one or more groups of middle states for all word lines, and lastly programming the group of low states for all word lines. As may be appreciated, the sequence determination module 304 may determine any suitable sequence that programs high storage states of a word line before programming low storage states of an adjacent word line.

In some embodiments, the high states programming module 306 programs the group of high states to word lines based on the sequence determined by the sequence determination module 304. For example, the high states programming module 306 may program memory cells of subsequent word lines in a monotonically increasing series to the group of high states. In certain embodiments, the low states programming module 308 programs the group of low states to word lines based on the sequence determined by the sequence determination module 304. For example, the low states programming module 308 may program memory cells of previous word lines in the monotonically increasing series to the group of low states after the high states programming module 306 programs memory cells of subsequent word lines in the monotonically increasing series such that one or more cells of a previous word line are not programmed to the group of low states until after the one or more cells of a subsequent word line have been programmed to the high states.

Figure 4:
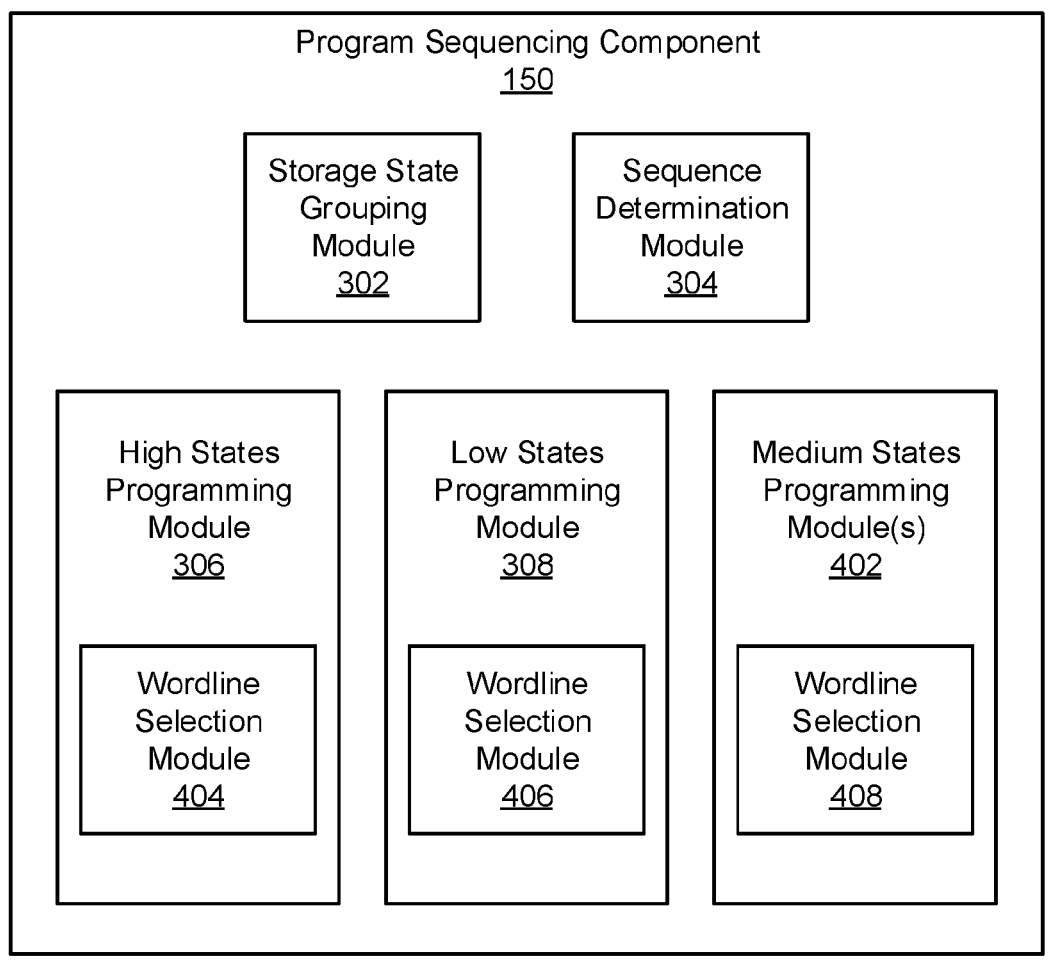
FIG. 4 is a schematic block diagram illustrating a further embodiment of a program sequencing component.

FIG. 4 depicts a further embodiment of a program sequencing component 150. The program sequencing component 150 may be substantially similar to the program sequencing component 150 described above with regard to FIGS. 1A, 1B, and/or 3. In the depicted embodiment, the program sequencing component 150 includes the storage state grouping module 302, the sequence determination module 304, the high states programming module 306, and the low states programming module 308 and further includes one or more medium states programming modules 402, and word line selection modules 404, 406, and 408. Each of the high states programming module 306, the low states programming module 308, and the one or more medium states programming modules 402 includes one of the word line selection modules 404, 406, and 408.

In one embodiment, the one or more medium states programming modules 402 programs one or more groups of medium states based on how the storage states are grouped by the storage state grouping module 302 and based on the sequence determined by the sequence determination module 304. Moreover, in one embodiment, the word line selection modules 404, 406, and 408 select the order and timing of word lines to program based on the sequence determination module 304.

Figure 5A:
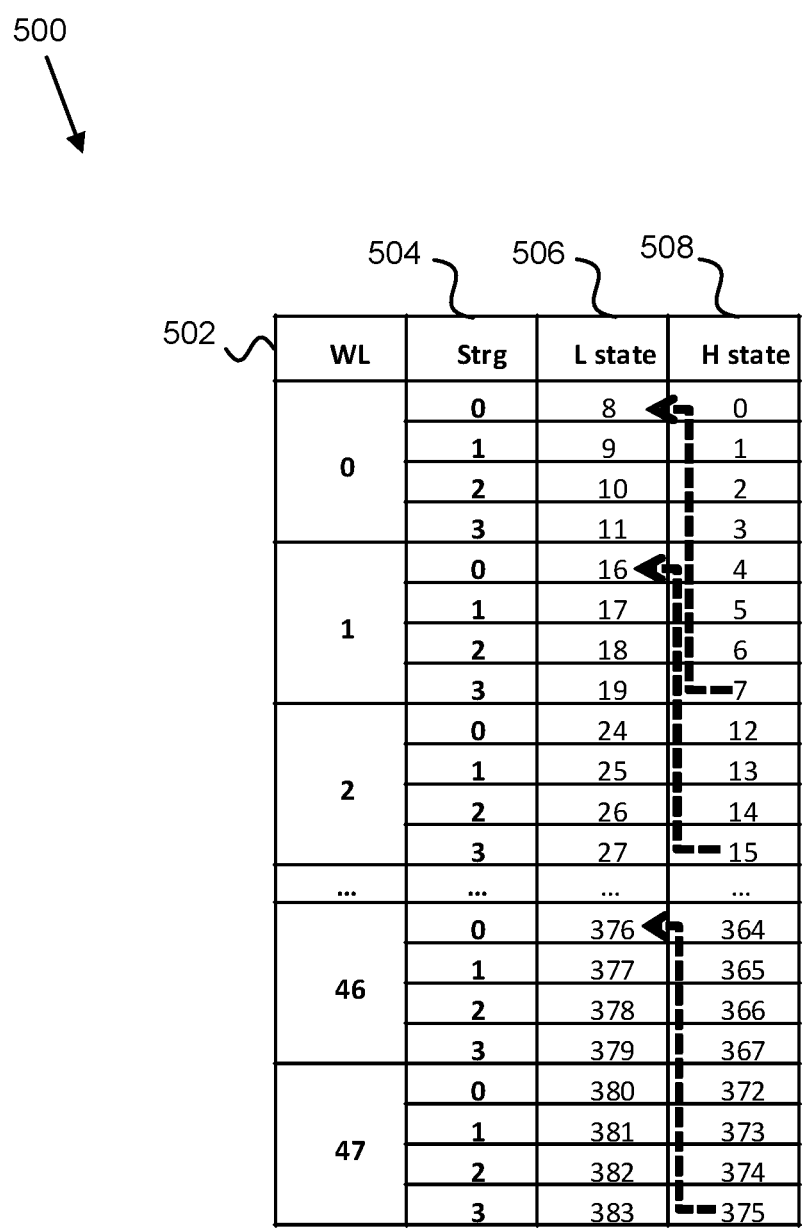
FIG. 5A is a chart illustrating one embodiment of program sequencing.

FIG. 5A is a chart 500 illustrating one embodiment of program sequencing. The chart 500 has columns for a word line number (WL) 502, a string number (Strg) 504, a group of low storage states (L state) 506, and a group of high storage states (H state) 508. The numbers in the group of low storage states 506 and the group of high storage states 508 columns indicate one embodiment of an order that word lines and strings are programmed to reduce word line interference caused by programming adjacent word lines, such as in cases in which a charge trap layer is shared by adjacent storage cells in a string (e.g., cells of different, adjacent, word lines). It should be noted, that in cases in which a charge trap layer is shared by storage cells of adjacent word lines, in certain embodiments, a fringing field from programming a word line may inject a charge into a previous (e.g., adjacent) word line, which may be referred to as a program disturb, or the like. As used herein, a fringing field refers to an electric field produced by scattered electrons that may occur from programming a word line. In certain embodiments, the scattered electrons from a fringing field may become trapped in a charge trap layer of one or more adjacent word lines to the word lines being programmed (e.g., in architectures with a shared charge trap layer or the like), adding charge (e.g., programming) the one or more adjacent word lines.

As illustrated, the group of high storage states 508 for word line 0 is programmed first, beginning with string 0 and ending with string 3 as illustrated by sequence numbers 0 through 3 in the group of high storage states 508 column. Next, the group of high storage states 508 for word line 1 is programmed, beginning with string 0 and ending with string 3 as illustrated by sequence numbers 4 through 7 in the group of high storage states 508 column.

Then, the group of low storage states 506 for word line 0 is programmed, beginning with string 0 and ending with string 3 as illustrated by sequence numbers 8 through 11. Following this, the group of high storage states 508 for word line 2 is programmed, beginning with string 0 and ending with string 3 as illustrated by sequence numbers 12 through 15. After this, the group of low storage states 506 for word line 1 is programmed, beginning with string 0 and ending with string 3 as illustrated by sequence numbers 16 through 19. As illustrated, this order of programming may be repeated until all word lines are programmed.

As may be appreciated, the strings 0 through 3 may be programmed in any suitable order. Accordingly, in certain embodiments, the strings may be programmed beginning with string 3 and ending with string 0, or in any possible order. It should be noted that while only groups of low and high storage states are illustrated, any number of groups of storage states may be programmed. For example, there may be a group of high storage states, a group of low storage states, and any number of groups of medium storage states. In such an embodiment, the group of high storage states are programmed for a number of word lines that matches the number of groups of storage states. For example, if there are 5 groups of storage states, then at first the group of high storage states are programmed for word lines 0 through 4. Then, the highest of the group of medium storage states is programmed for a number of word lines that is one less than the number of groups of storage states (e.g., word lines 0 through 3 are programmed), and so forth until word line 0 is programmed with the group of low storage states. Then each group of storage states is programmed to the next available word line that has not been programmed with that group of storage states, starting with the group of high storage states and going back to the group of low storage states. This order of programming may be repeated until all word lines have been programmed.

FIGS. 5B-E depict embodiments of storage state groups for a set of multi-level storage cells of solid-state storage media storing at least three bits (e.g., TLC storage cells). In some embodiments, the set of multi-level storage cells storing at least three bits comprises an upper page, a middle page, and a lower page, each page storing its own bit of the at least three bits. Each page (e.g., upper, middle, and lower) of a multi-level storage cell may be associated with a page group, the page group including a set of at least three pages that are associated with a single set of physical multi-level storage cells.

FIG. 5B depicts one embodiment of storage state groups 510 for the set of multi-level storage cell storing at least three bits. Specifically, FIG. 5B illustrates one embodiment of voltage levels for various storage states including: an erase storage state 512 that may have a voltage level of approximately 0 volts (e.g., between approximately −0.5 volts and approximately 0.5 volts); a storage state A 514 that may have a voltage level of approximately 1.0 volts (e.g., between approximately 0.5 volts and approximately 1.5 volts); a storage state B 516 that may have a voltage level of approximately 1.9 volts (e.g., between approximately 1.5 volts and approximately 2.25 volts); a storage state C 518 that may have a voltage level of approximately 2.6 volts (e.g., between approximately 2.25 volts and approximately 3.0 volts); a storage state D 520 that may have a voltage level of approximately 3.4 volts (e.g., between approximately 3.0 volts and approximately 3.75 volts); a storage state E 522 that may have a voltage level of approximately 4.1 volts (e.g., between approximately 3.75 volts and approximately 4.5 volts); a storage state F 524 that may have a voltage level of approximately 4.9 volts (e.g., between approximately 4.5 volts and approximately 5.25 volts); and a storage state G 526 that may have a voltage level of approximately 5.6 volts (e.g., between approximately 5.25 volts and approximately 6.0 volts). As may be appreciated, the voltages described above are examples of possible storage state voltages; however, the storage states may include any suitable voltages, currents, resistivity, and so forth.

In the illustrated embodiment of FIG. 5B, a threshold voltage of approximately 3.0 volts separates a group of low states 532 from a group of high states 534. Specifically, the group of low states 532 includes storage state A 514, storage state B 516, and storage state C 518. Moreover, the group of high states 534 includes storage state D 520, storage state E 522, storage state F 524, and storage state G 526. As may be appreciated, in other embodiments, the threshold voltage may be any suitable voltage.

FIG. 5C is a diagram illustrating another embodiment of storage state groups 536 for a multi-level storage cell of solid-state storage media storing at least three bits. In this embodiment, a threshold voltage of approximately 2.25 volts separates a group of low states 538 from a group of high states 540. Specifically, the group of low states 538 includes storage state A 514 and storage state B 516. Moreover, the group of high states 540 includes storage state C 518, storage state D 520, storage state E 522, storage state F 524, and storage state G 526.

FIG. 5D is a diagram illustrating yet another embodiment of storage state groups 542 for a multi-level storage cell of solid-state storage media storing at least three bits. In this embodiment, a threshold voltage of approximately 3.75 volts separates a group of low states 544 from a group of high states 546. Specifically, the group of low states 544 includes storage state A 514, storage state B 516, storage state C 518, and storage state D 520. Moreover, the group of high states 546 includes storage state E 522, storage state F 524, and storage state G 526.

FIG. 5E is a diagram illustrating a further embodiment of storage state groups 548 for a multi-level storage cell of solid-state storage media storing at least three bits. In this embodiment, a first threshold voltage of approximately 2.25 volts separates a group of low states 550 from a group of medium states 552, and a second threshold voltage of approximately 4.5 volts separates the group of medium states 552 from a group of high states 554. Specifically, the group of low states 550 includes storage state A 514 and storage state B 516. Moreover, the group of medium states 552 includes storage state C 518, storage state D 520, and storage state E 522. Furthermore, the group of high states 554 includes storage state F 524 and storage state G 526. Although three groups of storage states are described in this embodiment, other embodiments may include more than three groups of storage states.

Figure 6:
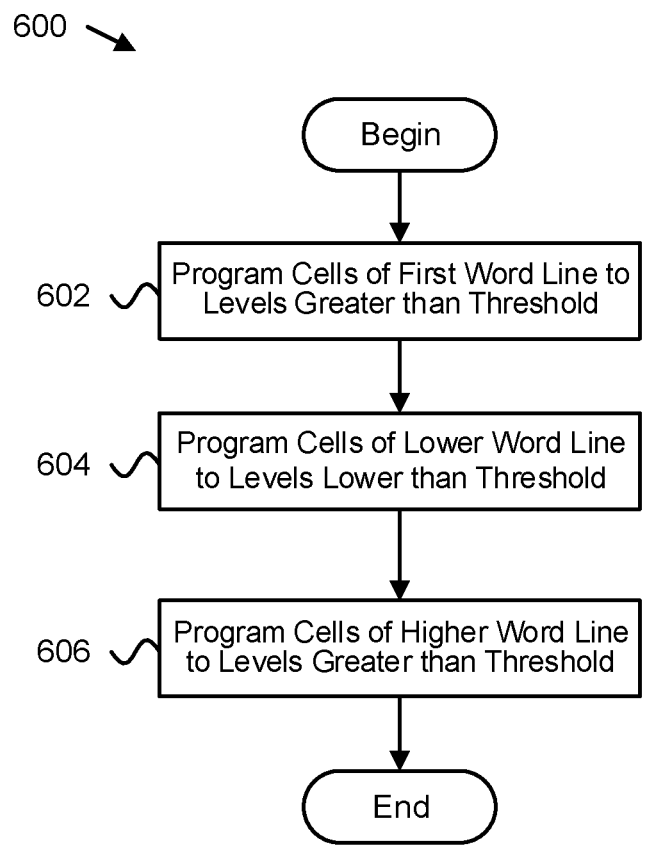
FIG. 6 is a schematic flow chart diagram illustrating one embodiment of a method for program sequencing.

FIG. 6 depicts one embodiment of a method 600 for program sequencing. The method 600 begins and the high states programming module 306 programs 602 a group of memory cells of a first word line to one or more charge levels (e.g., storage states) greater than a threshold level. The low states programming module 308 programs 604 a group of memory cells of a word line having a lower word line address than the first word line to one or more charge levels lower than the threshold level after programming the group of memory cells of the first word line to the one or more charge levels greater than the threshold level. The high states programming module 306 programs 606 a group of memory cells of a word line having a higher word line address than the first word line to the one or more charge levels greater than the threshold level after programming the group of memory cells of the word line having a lower word line address to the one or more charge levels lower than the threshold level, and the method 600 ends.

In some embodiments, the method 600 may include programming a different group of memory cells of the first word line to the one or more charge levels lower than the threshold level after programming the group of memory cells of the word line having the higher word line address to the one or more charge levels greater than the threshold level. In various embodiments, the method 600 may include iterating through additional word lines of a same erase block as the first word line, programming groups of memory cells of successive word lines in a word line address order to the one or more charge levels greater than the threshold level before programming groups of memory cells of previous word lines to the one or more charge levels lower than the threshold level.

In one embodiment, the first word line, the word line having a lower word line address, and the word line having a higher word line address are part of the same set of strings of three dimensional NAND structures. In such an embodiment, the method 600 may include interleaving the programming of word lines of one or more additional sets of strings of three dimensional NAND structures in the same order as the programming of the first word line, the word line having a lower word line address, and the word line having a higher word line address. In some embodiments, the first word line is physically adjacent to and between the word line having the lower word line address and the word line having the higher word line address. In certain embodiments, the first word line, the word line having the lower word line address, and the word line having the higher word line address share a charge trap layer.

Figure 7:
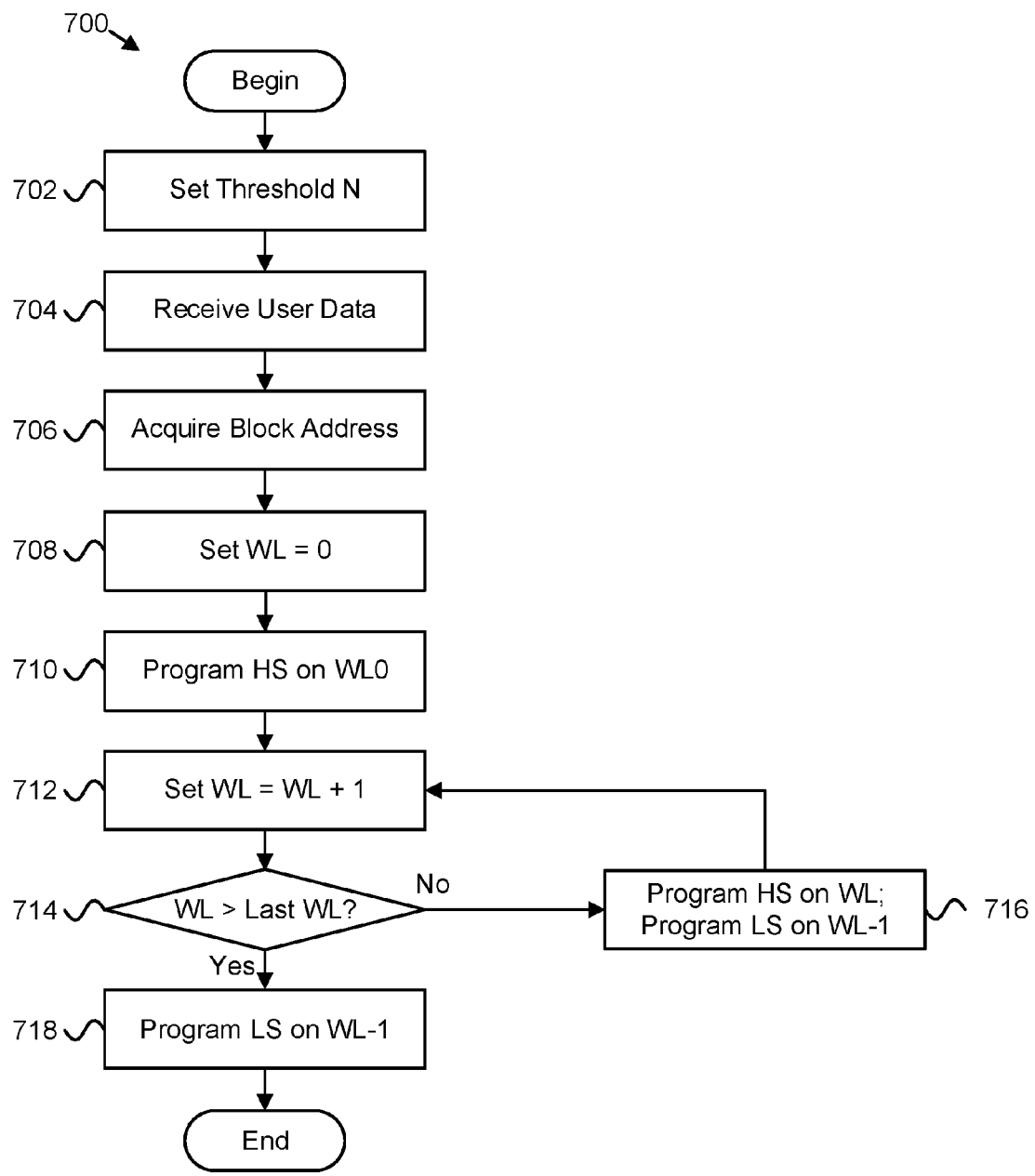
FIG. 7 is a schematic flow chart diagram illustrating a further embodiment of a method for program sequencing.

FIG. 7 is a schematic flow chart diagram illustrating a further embodiment of a method 700 for program sequencing. The method 700 begins, and the storage state grouping module 302 sets 702 a threshold N. The threshold N, in certain embodiments, is a threshold that divides the group of high states from the group of low states. Thus, with the threshold N set, the group of high states and the group of low states is determined (e.g., the group of high states has programming voltages greater than the threshold N, the group of low states has programming voltages less than the threshold N). The program sequencing component 150 receives 704 user data that is to be stored in memory cells.

The sequence determination module 304 acquires 706 a block address for storing the user data. The sequence determination module 304 sets 708 the word line (WL) equal to 0. The high states programming module 306 programs 710 the group of high states on WL0.

The sequence determination module 304 sets 712 WL equal to WL plus 1. The sequence determination module 304 determines 714 whether WL is greater than the last WL. In response to determining 714 that WL is not greater than the last WL, the high states programming module 306 programs 716 the group of high states on WL and the low states programming module 308 programs the group of low states on WL minus 1, then the method 700 returns to setting 712 WL equal to WL plus 1. In response to determining 714 that that WL is greater than the last WL, the low states programming module 308 programs 718 the group of low states on WL minus 1, then the method 700 ends.

A means for determining which cells of a non-volatile memory medium are to be programmed to one or more states above a read voltage threshold and which cells are to be programmed to one or more states below the read voltage threshold, in various embodiments, may include a program sequencing component 150, a sequence determination module 304, a non-volatile storage device interface 139, a non-volatile memory medium controller 126, a storage client 116, a database system 116a, a host computing device 110, a bus 127, a network 115, a device driver, a controller (e.g., a device driver, or the like) executing on a host computing device 110, a processor 111, other logic hardware, and/or other executable code stored on a computer readable storage medium. Other embodiments may include similar or equivalent means for determining which cells of a non-volatile memory medium are to be programmed to one or more states above a read voltage threshold and which cells are to be programmed to one or more states below the read voltage threshold. The non-volatile memory medium may include a monotonically increasing series of word lines of cells.

A means for programming cells of subsequent word lines in the monotonically increasing series to the one or more states above the read voltage threshold prior to programming cells of previous word lines in the monotonically increasing series to the one or more states below the read voltage threshold such that one or more cells of a previous word line are not programmed to the one or more states below the read voltage threshold until after one or more cells of a subsequent word line have been programmed to the one or more states above the read voltage threshold, in various embodiments, may include a program sequencing component 150, a sequence determination module 304, a non-volatile storage device interface 139, a non-volatile memory medium controller 126, a high states programming module 306, a low states programming module 308, one or more medium states programming modules 402, a storage client 116, a database system 116a, a host computing device 110, a bus 127, a network 115, a device driver, a controller (e.g., a device driver, or the like) executing on a host computing device 110, a processor 111, other logic hardware, and/or other executable code stored on a computer readable storage medium. Other embodiments may include similar or equivalent means for programming cells of subsequent word lines in the monotonically increasing series to the one or more states above the read voltage threshold prior to programming cells of previous word lines in the monotonically increasing series to the one or more states below the read voltage threshold such that one or more cells of a previous word line are not programmed to the one or more states below the read voltage threshold until after one or more cells of a subsequent word line have been programmed to the one or more states above the read voltage threshold. In some embodiments, the read voltage threshold is between about 2 and about 4 volts.

A means for interleaving the programming of word lines of one or more additional sets of strings of three dimensional NAND structures between the programming of the monotonically increasing series of word lines of cells in a same order as the programming of the monotonically increasing series of word lines of cells, the monotonically increasing series of word lines of cells being part of the same set of strings of three dimensional NAND structures, in various embodiments, may include a program sequencing component 150, a sequence determination module 304, a non-volatile storage device interface 139, a non-volatile memory medium controller 126, a high states programming module 306, a low states programming module 308, one or more medium states programming modules 402, a storage client 116, a database system 116a, a host computing device 110, a bus 127, a network 115, a device driver, a controller (e.g., a device driver, or the like) executing on a host computing device 110, a processor 111, other logic hardware, and/or other executable code stored on a computer readable storage medium. Other embodiments may include similar or equivalent means for interleaving the programming of word lines of one or more additional sets of strings of three dimensional NAND structures between the programming of the monotonically increasing series of word lines of cells in a same order as the programming of the monotonically increasing series of word lines of cells, the monotonically increasing series of word lines of cells being part of the same set of strings of three dimensional NAND structures.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:
1. An apparatus comprising:
a block of non-volatile storage cells comprising a plurality of word lines, the word lines organized into a monotonically increasing sequence; and
a controller for the block, the controller configured to:
determine a set of storage cells of a word line that are to be programmed to one or more storage states above a predetermined threshold;
determine a set of storage cells of a previous word line adjacent to and before the word line in the sequence that are to be programmed to one or more storage states below the predetermined threshold;
program the set of storage cells of the word line to the one or more storage states above the predetermined threshold; and program the set of storage cells of the previous word line to the one or more storage states below the predetermined threshold after programming the set or storage cells of the word line to the one or more storage states above the predetermined threshold, wherein the word line and the previous word line share at least a charge trap layer such that a fringing field from programming the word line injects charge into the previous word line.

2. The apparatus of claim 1, wherein the controller is configured to iterate through the word lines of the block, programming sets of storage cells of successive word lines to the one or more storage states above the predetermined threshold before programming sets of storage cells of previous word lines to the one or more storage states below the predetermined threshold.

3. The apparatus of claim 2, wherein the controller is configured to iterate through the word lines of the block until each word line comprises a set of storage cells programmed to the one or more storage states above the predetermined threshold and a set of storage cells programmed to the one or more storage states below the predetermined threshold.

4. The apparatus of claim 3, wherein the controller is configured to, for each of the word lines of the block, program the set of storage cells programmed to the one or more storage states above the predetermined threshold before programming the set of storage cells programmed to the one or more storage states below the predetermined threshold.

5. The apparatus of claim 1, wherein the word line is physically adjacent to the previous word line and has a higher word line address in the monotonically increasing sequence than a word line address of the previous word line.

6. The apparatus of claim 1, wherein the controller is configured to organize the word lines into the monotonically increasing sequence using addresses of the word lines.

7. The apparatus of claim 1, wherein the controller comprises a hardware storage controller in communication with a plurality of semiconductor chips of non-volatile storage, one of the semiconductor chips comprising the block of non-volatile storage cells.

8. The apparatus of claim 1, wherein the controller comprises a state machine on the same semiconductor chip as the block of non-volatile storage cells.

9. The apparatus of claim 1, wherein the controller comprises a device driver for a non-volatile storage device comprising the block of non-volatile storage cells, the device driver comprising a non-transitory computer readable storage medium storing executable code of the controller.

10. A method comprising:
determining a group of memory cells of a first word line that are to be programmed to one or more charge levels greater than a threshold level;
determining a group of memory cells of a word line having a lower word line address than the first word line that are to be programmed to one or more charge levels greater than the threshold level;
determining a group of memory cells of a word line having a higher word line address than the first word line that are to be programmed to one or more charge levels lower than the threshold level;
programming the group of memory cells of the first word line to the one or more charge levels greater than the threshold level;
programming the group of memory cells of a word line having a lower word line address than the first word line to the one or more charge levels lower than the threshold level after programming the group of memory cells of the first word line to the one or more charge levels greater than the threshold level; and
programming the group of memory cells of a word line having a higher word line address than the first word line to the one or more charge levels greater than the threshold level after programming the group of memory cells of the word line having a lower word line address to the one or more charge levels lower than the threshold level.

11. The method of claim 10, further comprising programming a different group of memory cells of the first word line to the one or more charge levels lower than the threshold level after programming the group of memory cells of the word line having the higher word line address to the one or more charge levels greater than the threshold level.

12. The method of claim 10, further comprising iterating through additional word lines of a same erase block as the first word line, programming groups of memory cells of successive word lines in a word line address order to the one or more charge levels greater than the threshold level before programming groups of memory cells of previous word lines to the one or more charge levels lower than the threshold level.

13. The method of claim 10, wherein the first word line, the word line having a lower word line address, and the word line having a higher word line address are part of the same set of strings of three dimensional NAND structures.

14. The method of claim 13, further comprising interleaving the programming of word lines of one or more additional sets of strings of three dimensional NAND structures in the same order as the programming of the first word line, the word line having a lower word line address, and the word line having a higher word line address.

15. The method of claim 1, wherein the first word line is physically adjacent to and between the word line having the lower word line address and the word line having the higher word line address.

16. An apparatus comprising:
means for determining which cells of a non-volatile memory medium are to be programmed to one or more states above a read voltage threshold and which cells are to be programmed to one or more states below the read voltage threshold, the non-volatile memory medium comprising a monotonically increasing series of word lines of cells; and
means for programming cells of subsequent word lines in the monotonically increasing series to the one or more states above the read voltage threshold prior to programming cells of previous word lines in the monotonically increasing series to the one or more states below the read voltage threshold such that one or more cells of a previous word line are not programmed to the one or more states below the read voltage threshold until after one or more cells of a subsequent word line have been programmed to the one or more states above the read voltage threshold, wherein the read voltage threshold is between about 2 and about 4 volts.

17. The apparatus of claim 16, further comprising means for interleaving the programming of word lines of one or more additional sets of strings of three dimensional NAND structures between the programming of the monotonically increasing series of word lines of cells in a same order as the programming of the monotonically increasing series of word lines of cells, the monotonically increasing series of word lines of cells being part of the same set of strings of three dimensional NAND structures.

18. The apparatus of claim 16, wherein the read voltage threshold is between about 2.5 and about 3.5 volts.

* * * * *